United States Patent [19]

Ecklund et al.

[11] Patent Number: 5,524,290
[45] Date of Patent: Jun. 4, 1996

[54] ADAPTIVE GRAPHIC EQUALIZER AND RADIO USING SAME

[75] Inventors: Lawrence M. Ecklund, Wheaton; Gregory J. Buchwald; Steven G. Parmelee, both of Crystal Lake, all of Ill.

[73] Assignee: Motorola, Inc., Schaumburg, Ill.

[21] Appl. No.: 733,577

[22] Filed: Jul. 22, 1991

[51] Int. Cl.⁶ ............................................. H03G 5/16
[52] U.S. Cl. ........................... 455/200.1; 455/233.1; 455/266; 455/267; 333/28 T; 381/102; 381/103
[58] Field of Search ..................... 455/200.1, 233.1, 455/266, 267, 340; 333/28 R, 28 T; 381/86, 98, 101–103

[56] References Cited

U.S. PATENT DOCUMENTS 4,405,836 9/1983 Meyerhoff .............................. 381/103
4,688,258 8/1987 Kunugi et al. ......................... 381/103
4,845,758 7/1989 Op de Beek et al. ................... 381/98
4,891,841 1/1990 Bohn ..................................... 381/98

FOREIGN PATENT DOCUMENTS 0095008 5/1987 Japan ..................................... 381/103
4032749 12/1991 Japan ..................................... 381/98

Primary Examiner—Chi H. Pham
Attorney, Agent, or Firm—Steven G. Parmelee

[57] ABSTRACT

An adaptive graphic equalizer (200, 400) has various ordinarily fixed parameters (such as center frequencies, filter bandwidths, and step response sensitivity) that are automatically altered to suit a particular audio source. In one embodiment, a radio (100) includes the graphic equalizer, and such adjustments are automatically made depending upon whether the user has selected the AM or FM reception band.

15 Claims, 1 Drawing Sheet

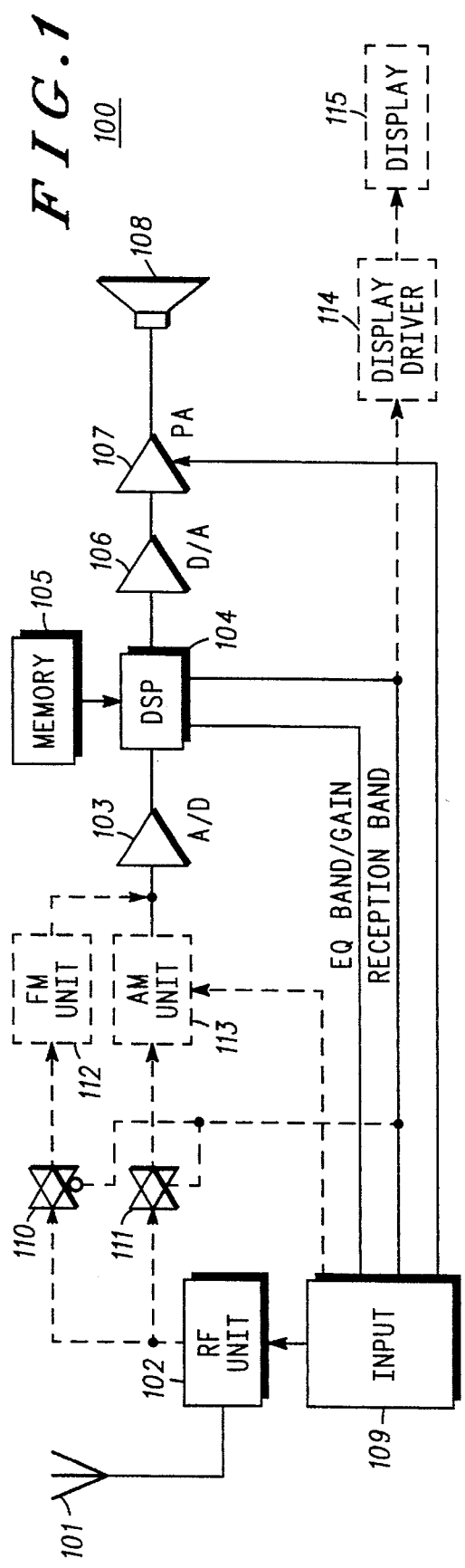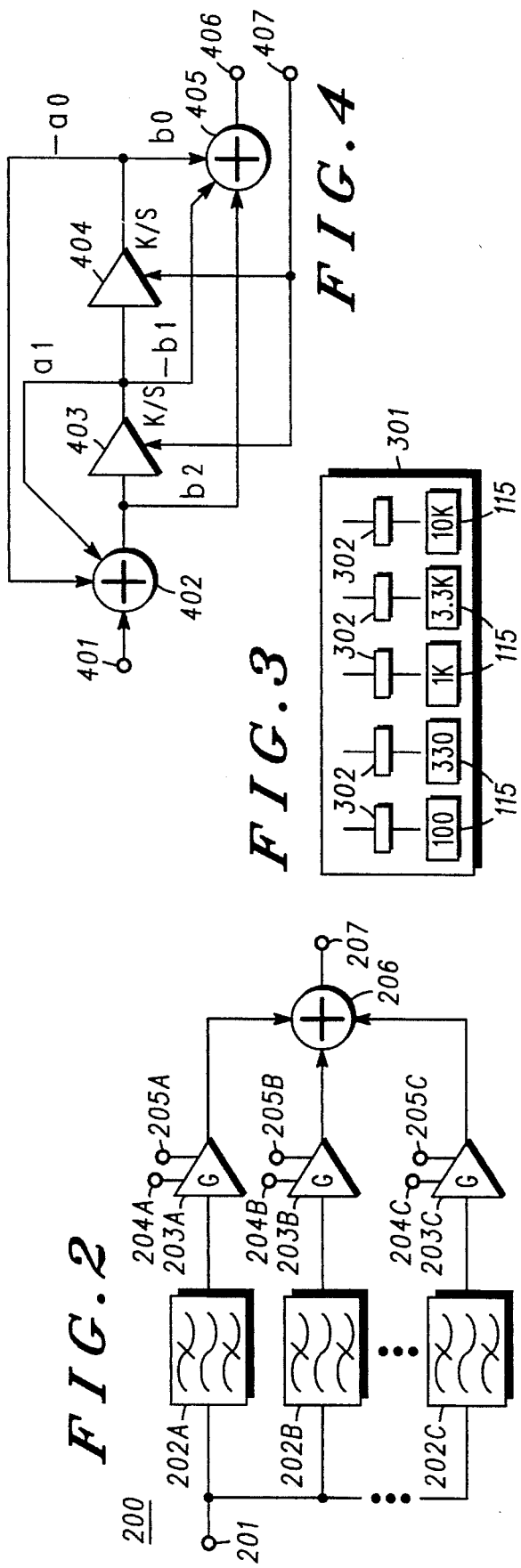

ADAPTIVE GRAPHIC EQUALIZER AND RADIO USING SAME

FIELD OF THE INVENTION

This invention relates generally to audio processing including, but not limited to, graphic equalizers.

BACKGROUND OF THE INVENTION

Graphic equalizers are well known in the art. Typically, a graphic equalizer comprises a plurality of filters that each have a variable gain/attenuation associated therewith. The center frequencies for the various filters are distributed across an overall bandwidth having a upper and lower boundary. For example, a typical five band graphic equalizer has five such filters with the following corresponding center frequencies: 100 Hz, 330 Hz, 1 kHz, 3.3 kHz, and 10 kHz.

Graphic equalizers comprise a useful audio processing device, often allowing a listener to compensate for differences in taste or acoustic surroundings as appropriate. Typically, however, prior art graphic equalizers constitute relatively fixed audio processing platforms. Although the gain or attenuation associated with a particular band can be selectively altered by a user, other filter attributes (such as center frequency, filter bandwidth, and step sensitivity) remain fixed. When a particular graphic equalizer has been well matched to a particular audio source, this inflexibility does not typically present a problem. Where, however, a graphic equalizer is intended for use with a variety of different audio sources, problems can arise.

For example, consider a typical prior art five band graphic equalizer for use with a radio that receives both AM broadcasts (in the United States, those broadcasts occurring between 540 kHz and 1700 kHz) and FM band broadcasts (in the United States, those transmissions occurring between 88 MHz and 108 MHz). FM transmissions typically accommodate an audio signal having up to a 15 kHz bandwidth. A typical five band graphic equalizer, though not necessarily optimized for such a signal, will offer reasonable opportunity for useful audio processing. AM broadcasts, however, typically restrict the audio content to a more limited 10 kHz bandwidth. With such a signal, the graphic equalizer high frequency bandpass (or highpass) filter having a center frequency at 10 kHz will obviously support little or no useful audio processing flexibility.

One prior art solution provides a graphic equalizer having a large number of bands. So configured, suitable filters could likely be found to accommodate appropriate processing for most any audio source. While this solution works well in some limited applications, the increased costs and complexity associated with this solution render this approach inappropriate for general application.

Accordingly, a need exists for a graphic equalizer that can better accommodate a variety of different audio sources.

SUMMARY OF THE INVENTION

This need and others are substantially met through provision of the audio processing device disclosed herein. The device includes generally an input, a source selector, and a multiband graphic equalizer responsive to the source selector. The input couples to receive a signal to be processed. The source selector couples to the input and enables selection of a particular audio source. The center frequencies of the multiband graphic equalizer are responsive to selection of a particular audio source, and are automatically adjusted in response thereto.

In one embodiment of the invention, the source selector allows selection between at least two different radio frequency reception bands.

In another embodiment of the invention, the device includes a display that also responds to the source selector by displaying current information regarding the center frequencies for the multiband graphic equalizer.

In yet another embodiment of the invention, the filter bandwidths and/or step response for the graphic equalizer can also be automatically adjusted in response to selection of a particular audio source.

In yet another embodiment of the invention, a radio can embody the automatically adjustable graphic equalizer, such that selection of a particular radio band will cause automatic adjustment of the graphic equalizer, to thereby configure the graphic equalizer in a manner best accommodating to the radio band selected.

BRIEF DESCRIPTION OF THE DRAWINGS

FIG. 1 comprises a block diagram depiction of a radio constructed in accordance with the invention;

FIG. 2 comprises a block diagram depiction of an embodiment of a graphic equalizer in accordance with the invention;

FIG. 3 comprises a front elevational view of a graphic equalizer constructed in accordance with the invention; and FIG. 4 comprises a schematic depiction of a state variable filter element for the embodiment of a graphic equalizer in accordance with the invention.

DESCRIPTION OF A PREFERRED EMBODIMENT

FIG. 1 depicts a first and second embodiment of a two band radio receiver constructed in accordance with the invention as depicted generally by reference numeral 100. An antenna (101) receives a broadcast signal of interest, which signal is then recovered from its carrier in an RF unit (102) in accordance with well understood prior art technique. In this embodiment, the RF unit (102) can properly receive carrier frequencies in a first band ranging from about 540 kHz to 1700 kHz, and carrier frequencies in a second band that ranges from about 88 MHz to 108 MHz (the latter two bands corresponding to the AM and FM bands in the United States). An input unit (109) couples to the RF unit (102) to allow a user to select a particular reception band and to further tune the RF unit (102) to receive only a particular broadcast signal of interest within the selected band, all in accordance with prior art technique.

In a first embodiment of the radio receiver (100) the analog output of the RF unit (102) couples through an analog to digital converter (103) to a digital signal processor (DSP) (104) such as a Motorola DSP 56000. In this embodiment, the DSP (104) is programmed, in accordance with prior art technique, to detect the modulating signal and thereby recover the original audible signal that was utilized to modulate the carrier. In this embodiment, however, in addition to the above, the DSP (104) is also programmed to implement an adaptive graphic equalizer, as described below in more detail. (Depending upon the complexity of the adaptive graphic equalizer configured to suit a particular application, it may be necessary to cascade one or more additional DSPs in order to assure adequate processing capabilities.) An associated memory (105) provides the DSP (104) with necessary programming information to carry out the above activities.

The output of the DSP (104) constitutes a digital representation of the recovered audio signal. This digitized representation passes through a digital to analog converter (106) to yield an audio signal, which audio signal is subsequently amplified in a power amplifier (107) and then rendered audible by one or more loud speakers (108).

The previously mentioned input unit (109) also couples to the DSP (104) and to the power amplifier (107). The input to the DSP (104) allows information regarding which reception band has been selected by a user to be provided to the DSP for purposes to be made clear below, and allows user sourced equalization information to be provided to the DSP (104). In particular, band and gain/attenuation information, representing equalization adjustments as made by the user in accordance with prior art technique, are communicated to the DSP (104) to allow those adjustments to be effectuated.

Referring for the moment to FIG. 2, a graphic equalizer (200) suitable for implementation within the DSP (104) will be described. As well understood in the art, the functions to be described will, in practice, be effectuated through appropriate programming of the DSP. For purposes of assuring an adequate understanding of the invention, however, it is preferable here to describe the functional workings of this programming.

The graphic equalizer (200) includes an input (201) that provides the recovered audio signal to a plurality of bandpass filters (202A–202C). There can be virtually any number of these bandpass filters, though from three to seven are typical. Each bandpass filter (202A–202C) has an associated center frequency and bandwidth. Both of these parameters are readily alterable in a DSP based embodiment by simple parameter variations.

Each bandpass filter (202A–202C) couples through a gain stage (203A–203C) to a summation node (206), which couples to an output node (207). The gain stages (203A–203C) each include a first control line (204A–204C) for adjusting the gain/attenuation of the corresponding gain stage. This control effectively implements the user information provided via the input unit (109) as described above. Each gain stage also includes a second control line (205A–205C) that allows the step response of the gain stage to be selectively varied. In particular, the control line alters the sensitivity of the gain stage to the first control line (204A–204C). When rendered relatively insensitive via the second control line (205A–205C), the gain stage must receive increased input (either instantaneously or over time) at the first control line (204A–204C) before an alteration to the gain/attenuation of that gain stage will be effected, as compared to when the gain stage is rendered relatively sensitive. Similarly, when sensitivity of the gain stages has been set high, a very small change to the input of the first control line (204A–204C) will result in a relatively significant change in corresponding gain/attenuation.

So configured, the graphic equalizer (200) will allow an audio signal to be selectively processed through amplification or attenuation of the audio components residing within particular preselected frequency bands that in total comprise the audio signal. With the above configuration in mind, an important attribute of the invention should now be understood. When a user selects a particular broadcast signal of interest, various parameters of the graphic equalizer (200) are automatically adjusted to best accommodate that selected signal. In this particular embodiment, this is effectuated by providing to the DSP (104) information regarding the particular radio reception band (AM or FM) currently selected by the user. Presuming a five band graphic equalizer, when the user selects the AM band, the DSP (104) automatically configures itself such that its five center frequencies have the following corresponding values: 85 Hz, 240 Hz, 700 Hz, 2.4 kHz, and 6.2 kHz. Conversely, when the user selects the FM band these same center frequencies are adjusted to these values: 55 Hz, 200 Hz, 700 Hz, 3.5 kHz, and 10 kHz. At the same time, the bandwidth of one or more of the bandpass filters can also be adjusted, by widening or narrowing, to suit the particular center frequencies chosen. Also, if desired, the step response sensitivity of the gain/attenuation adjustment for each band can also be varied. For example, in the AM band, sensitivity can be set to represent one-half dB in change per each one (1) volt of input control signal (or per each mechanical actuation of a user control, such as a pushbutton), and when processing signals recovered from the FM band, the step response can be set instead, for example, to 2 dB per one (1) volt of input control signal (or, again, per each mechanical actuation of a user control).

In this embodiment, the actual EQ settings themselves as selected by a user are not automatically adjusted. If desired, of course, the latter could be achieved as well, particularly if additional processing capability and memory is provided to allow a user to store setting preferences that correspond to various reception bands and/or audio sources.

In an alternative embodiment of the radio receiver (100) (FIG. 1), the DSP (104) is relieved of demodulation processing, and instead functions primarily to provide the adaptive graphic equalization processes described above. An FM unit (112) and an AM unit (113) can instead be provided to effectuate the desired demodulation activity. To facilitate the latter, the output of the RF unit (102) can pass through two logic gates (110 and 111) that are in turn controlled by the reception band selection output of the input unit (109). (In the alternative, power up/power down of each demodulation platform could be used to effectuate the same kind of control.) As configured, only one of the logic gates (110 and 111) can be enabled at any given moment, and hence only the FM unit (112) or the AM unit (113) will be operable at any given moment, depending upon which band has been selected by the user.

In the above described embodiments, only a single audio processing path has been depicted and described. If one wishes to accommodate stereo information processing, then a parallel audio processing path could of course be included. Such a parallel path could potentially utilize the same DSP as the first path, presuming that the processing capabilities of the DSP are adequate to the task. Also, if the radio receiver (100) has stereo processing capabilities, then the AM unit (113) may include a Motorola MC13022 AM stereo decoder, which will decode AM stereo broadcast signals and provide a stereo information output.

If desired, a display driver (114) and associated display (115) can be further coupled to receive reception band information from the input unit (109). So configured, the display (115) can provide a visual display to the user regarding current graphic equalizer information, such as current center frequencies and/or sensitivity per band. With reference to FIG. 3, a graphic equalizer user interface (301) (the latter comprising a portion of the input unit (109)) can include a plurality of faders (302) that allow a user to select a particular graphic equalizer band and to adjust its corresponding gain or attenuation. In addition, the display (115) includes a plurality of discrete displays, each being associated proximally with a corresponding fader (302). Current center frequency information for each band can then be displayed, thereby allowing a user to make informed use of the graphic equalizer.

If desired, other platforms for attaining the adaptive graphic equalizer can of course be substituted for the DSP embodiment described above. For example, FIG. 4 depicts a typical state variable filter (400) that can be utilized as the bandpass filter in such a graphic equalizer. (For additional information regarding state variable filters, the interested reader is referred to I.E.E.E. Volume 6, pages 64–68 (Dec. 1969) by Tow.) In this state variable filter (400), an input (401) for receiving the audio signal to be processed couples to a summation block (402) and then to the input of a first stage (403) having a transfer function of k/S (where "k" represents the gain of the integrator, such that k/S defines the total frequency) and also to a second summation node (405). The output of the first stage (403) feeds back to the first summation node (402), feeds forward to the second summation node (405), and couples to the input of second k/S stage (404). In a similar manner, the output of the second stage (404) feeds back to the first summation node (402) and couples also to the second summation node (405).

The second summation node (405) couples to provide the output (406) for the filter (400). Control lines for the two k/S stages (403 and 404) couple to a control line input (407) to allow k to be selectively varied. (In a typical bandpass filter configuration, b2 and b0 equal 0, and the only input to the summer (405) is −b1.) So configured, the center frequency of the bandpass filter represented by this state variable filter (400) can be readily altered via the control line (407). The steering signal provided to the control line (407) can be automatically varied to accommodate a particular reception band or audio source as described above.

A number of benefits are obtained through provision of the adaptive graphic equalizers described above. The ordinarily fixed parameters of the various bands comprising the graphic equalizer are automatically altered to accommodate a variety of audio sources, including but not limited to radio reception bands and/or type of audio source such as radio, tape, compact disk, and so forth. This avoids the need for an expensive and complicated graphic equalizer having a high number of bands, while simultaneously assuring that adequate processing can be readily attained regardless of the characteristics of the selected audio source.

What is claimed is:

1. A radio, comprising:
   A) receiver means for selectively receiving signals of interest;
   B) input means operably coupled to the receiver means for selecting a particular signal of interest;
   C) audio processing means operably coupled to the receiver means and the input means for converting the particular signal of interest into an audible signal, wherein the audio processing means includes:
      i) a multi-band graphic equalizer having a plurality of filter bandwidths that are automatically adjusted in response to selection of a particular signal of interest.

2. The radio of claim 1, wherein the input means includes reception band select means for selecting a particular reception frequency band.

3. The radio of claim 2, wherein the reception band select means allows selection of one of a first reception frequency band and a second reception frequency band.

4. The radio of claim 3, wherein the first reception frequency band includes frequencies from 540 kHz to 1700 kHz, and the second reception frequency band includes frequencies from 88 MHz to 108 MHz.

5. A radio, comprising:
   A) receiver means for selectively receiving signals of interest;
   B) input means operably coupled to the receiver means for selecting a particular signal of interest;
   C) audio processing means operably coupled to the receiver means and the input means for converting the particular signal of interest into an audible signal, wherein the audio processing means includes:
      i) a multi-band graphic equalizer having input control amplitude step responses that are automatically adjusted in response to selection of a particular signal of interest.

6. The radio of claim 5, wherein the input means includes reception band select means for selecting a particular reception frequency band.

7. The radio of claim 6, wherein the reception band select means allows selection of one of a first reception frequency band and a second reception frequency band.

8. The radio of claim 7, wherein the first reception frequency band includes frequencies from 540 kHz to 1700 kHz, and the second reception frequency band includes frequencies from 88 MHz to 108 MHz.

9. A radio, comprising:
   A) receiver means for selectively receiving signals of interest;
   B) input means operably coupled to the receiver means for selecting a particular signal of interest;
   C) audio processing means operably coupled to the receiver means and the input means for converting the particular signal of interest into an audible signal, wherein the audio processing means includes:
      i) a multi-band graphic equalizer having a plurality of center frequencies and corresponding filter bandwidths that are automatically adjusted in response to selection of a particular signal of interest.

10. The radio of claim 9, wherein the input means includes reception band select means for selecting a particular broadcast frequency band.

11. The radio of claim 10, wherein the reception band select means allows selection of one of a first reception frequency band and a second reception frequency band.

12. The radio of claim 11, wherein the first reception frequency band includes frequencies from 540 kHz to 1700 kHz, and the second reception frequency band includes frequencies from 88 MHz to 108 MHz.

13. The radio of claim 9, wherein the audio processing means further includes display means for displaying current information regarding at least one of the center frequencies and amplitude step responses.

14. The radio of claim 13, wherein the multi-band equalizer further includes a user interface that corresponds to each center frequency, and wherein the display means includes a corresponding discrete display disposed proximal to each of the user interfaces.

15. The radio of claim 9, wherein the multi-band graphic equalizer further has input control step responses that are automatically adjusted in response to selection of a particular signal of interest.

* * * * *